(12) United States Patent
Lee

(10) Patent No.: US 12,267,960 B2
(45) Date of Patent: Apr. 1, 2025

(54) ELECTRONIC COMPONENT SUB-MOUNT AND ELECTRONIC DEVICE USING THE SAME

(71) Applicant: Lextar Electronics Corporation, Hsinchu (TW)

(72) Inventor: Ming-Jing Lee, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 186 days.

(21) Appl. No.: 18/047,337

(22) Filed: Oct. 18, 2022

(65) Prior Publication Data

US 2023/0128068 A1  Apr. 27, 2023

(30) Foreign Application Priority Data

Oct. 21, 2021  (TW) .................................. 110139049

(51) Int. Cl.
*H05K 1/02* (2006.01)
*H01L 33/02* (2010.01)
(Continued)

(52) U.S. Cl.
CPC ............. *H05K 1/181* (2013.01); *H05K 1/115* (2013.01); *H05K 2201/09227* (2013.01);
(Continued)

(58) Field of Classification Search
CPC .......... H05K 1/02; H05K 1/115; H05K 1/141; H05K 1/147; H05K 1/181;
(Continued)

(56) References Cited

U.S. PATENT DOCUMENTS 7,967,491 B2 *  6/2011  Hsu ..................... H01L 33/60
                                         362/249.02
9,018,618 B1 *  4/2015  Lee ..................... H01S 5/34333
                                         257/14
(Continued)

FOREIGN PATENT DOCUMENTS

TW          200830587 A      7/2008

OTHER PUBLICATIONS

Chinese language office action dated Apr. 1, 2022, issued in application No. TW 110139049.

*Primary Examiner* — Xiaoliang Chen
(74) *Attorney, Agent, or Firm* — McClure, Qualey & Rodack, LLP

(57) ABSTRACT

An electronic component sub-mount includes a body having a top surface, a bottom surface, and a supporting surface. The top and bottom surfaces are located on opposite sides of the body. The supporting surface is located on one side of the body, and an angle that is not equal to 0 degrees is formed between the supporting surface and the bottom surface. A first conductive layer is disposed on the bottom surface and includes multiple first conductive lines. A second conductive layer is disposed on the supporting surface, extending to the top surface, and includes multiple second conductive lines. The second conductive lines on the supporting surface have a first pin layout, and the second conductive lines on the top surface have a second pin layout different from the first pin layout. The second pin layout matches the pin layout of first conductive lines on the bottom surface.

5 Claims, 8 Drawing Sheets

(51) Int. Cl.

| | |
|---|---|
| *H01L 33/06* | (2010.01) |
| *H01L 33/08* | (2010.01) |
| *H01L 33/14* | (2010.01) |
| *H01L 33/18* | (2010.01) |
| *H01L 33/20* | (2010.01) |
| *H01L 33/24* | (2010.01) |
| *H01L 33/32* | (2010.01) |
| *H01L 33/44* | (2010.01) |
| *H01L 33/46* | (2010.01) |
| *H01L 33/52* | (2010.01) |
| *H01L 33/54* | (2010.01) |
| *H01L 33/60* | (2010.01) |
| *H05K 1/11* | (2006.01) |
| *H05K 1/18* | (2006.01) |

(52) U.S. Cl.
CPC .............. *H05K 2201/10106* (2013.01); *H05K 2201/10121* (2013.01); *H05K 2201/10484* (2013.01); *H05K 2201/10628* (2013.01)

(58) Field of Classification Search
CPC .......... H05K 2201/09227; H05K 2201/10106; H05K 2201/10121; H05K 2201/10484; H05K 2201/10628; H01L 21/481; H01L 23/562; H01L 23/49816; H01L 25/105; H01L 33/002; H01L 33/005; H01L 33/0095; H01L 33/025; H01L 33/06; H01L 33/08; H01L 33/14; H01L 33/18; H01L 33/20; H01L 33/24; H01L 33/32; H01L 33/44; H01L 33/46; H01L 33/52; H01L 33/54; H01L 33/56; H01L 33/60; H01L 33/145; H01L 33/486; H01L 33/505; H01L 33/507; H01L 33/508; H01L 33/562; H01L 33/642

USPC ................ 361/748; 362/84, 191, 247, 249.2, 362/296.01, 311.02, 382, 396, 398, 427, 362/800; 174/261; 257/9, 13, 94, 738; 438/341

See application file for complete search history.

(56) References Cited

U.S. PATENT DOCUMENTS

| | | | |
|---|---|---|---|
| 2004/0118603 A1* | 6/2004 | Chambers ............. | H04L 7/0037 174/261 |
| 2007/0007540 A1* | 1/2007 | Hashimoto ........... | H01L 33/642 257/94 |
| 2012/0218737 A1* | 8/2012 | Komatsu ................... | F21V 7/00 362/247 |
| 2012/0299183 A1* | 11/2012 | Fujisawa ............... | H01L 25/105 257/E23.021 |
| 2014/0284731 A1 | 9/2014 | Nakao et al. | |
| 2014/0313708 A1* | 10/2014 | Cheng ..................... | F21V 21/30 362/396 |
| 2015/0118777 A1* | 4/2015 | Seo ......................... | H01L 33/32 438/34 |
| 2015/0194571 A1* | 7/2015 | Lee ......................... | H01L 33/08 257/94 |
| 2015/0372186 A1* | 12/2015 | Cha ........................ | H01L 33/005 438/34 |
| 2015/0372194 A1* | 12/2015 | Cha ........................ | H01L 33/24 257/9 |
| 2016/0072007 A1* | 3/2016 | Choi ................... | H01L 33/0025 315/291 |
| 2016/0349445 A1* | 12/2016 | Kim ........................ | H01L 33/56 |
| 2017/0077348 A1* | 3/2017 | Lim ........................ | H01L 33/44 |
| 2017/0186810 A1* | 6/2017 | Lee ......................... | H01L 33/62 |
| 2018/0212118 A1* | 7/2018 | Chen ....................... | H01L 33/56 |
| 2021/0148548 A1* | 5/2021 | Hou ........................ | F21V 23/06 |
| 2022/0166185 A1* | 5/2022 | Miyagoshi ............ | H01S 5/0231 |

\* cited by examiner

ELECTRONIC COMPONENT SUB-MOUNT AND ELECTRONIC DEVICE USING THE SAME

CROSS REFERENCE TO RELATED APPLICATIONS

This application claims priority of Taiwan Patent Application No. 110139049, filed on Oct. 21, 2021, the entirety of which is incorporated by reference herein.

BACKGROUND OF THE DISCLOSURE

Field of the Disclosure

The present disclosure relates to an electronic component sub-mount and an electronic component module and electronic device made by using the electronic component sub-mount. In particular, it relates to an optoelectronic component (for example, a light-emitting diode) sub-mount and an optoelectronic component module and optoelectronic device made by using the optoelectronic component sub-mount.

Description of the Related Art

Light-emitting diodes (LEDs) are widely used in various applications, such as illumination, backlight, and light-emitting diode displays. Due to the advantages of small size, long service life, low power consumption and high brightness, light-emitting diodes have gradually replaced traditional light bulbs and become one of the most important light-emitting elements.

The electrodes of the light-emitting diode are coupled to a circuit substrate which can relay voltage to the p/n junction of the light-emitting diode to make it emit light when in use. There are many methods for mounting light-emitting diodes on circuit substrates. One of the most common methods is to use surface mount technology (SMT).

BRIEF SUMMARY OF THE DISCLOSURE

In some applications, smart security applications for example, in order to match the lens field of view or fill light in a specific area, the optical axis of the light-emitting diode needs to be turned to different angles which is not perpendicular to the mounting surface of the circuit substrate. The design of the conventional sub-mount cannot meet this requirement. Therefore, an additional optical element (such as a lampshade) designed with a special structure is needed to change the light output angle of the light-emitting diode, which cause the cost higher.

In view of the aforementioned conventional problems, an object of the present disclosure is to provide an improved sub-mount for electronic components (for example, optoelectronic components such as light-emitting diodes). After the optoelectronic component is mounted on the circuit substrate through this sub-mount, its optical axis can form a specific angle with the mounting surface of the circuit substrate (i.e., Off-Axis design), without using an additional optical element (such as a lampshade) with special optical structure design. Therefore, it can meet different application requirements and reduce costs.

Another propose of the present disclosure is to provide an electronic component sub-mount, the electrodes (or conductive lines) of the component supporting surface and the lower bonding surface have different pin layouts to be compatible with electronic components of different designs.

An embodiment of the present disclosure provides an electronic component sub-mount, which is adapted to support an electronic component. The electronic component sub-mount includes a body, a first conductive layer, and a second conductive layer. The body has a top surface, a bottom surface, and a supporting surface. The top surface and the bottom surface are located on opposite sides of the body. The supporting surface is located on one side of the body between the top surface and the bottom surface, and an angle more than 0 degrees is substantially formed between the supporting surface and the bottom surface. The first conductive layer is disposed on the bottom surface and includes a plurality of first conductive lines. The second conductive layer is disposed on the supporting surface and extends to the top surface. The second conductive layer includes a plurality of second conductive lines. The second conductive lines on the supporting surface have a first pin layout, and the second conductive lines on the top surface have a second pin layout that is different from the first pin layout. The second pin layout matches the pin layout of the first conductive lines on the bottom surface.

Another embodiment of the present disclosure provides an electronic device. The electronic device includes an electronic component module and a substrate. The electronic component module includes an electronic component sub-mount and an electronic component. The electronic component sub-mount includes a body, a first conductive layer, and a second conductive layer. The body has a top surface, a bottom surface, and a supporting surface. The top surface and the bottom surface are located on opposite sides of the body. The supporting surface is located on one side of the body between the top surface and the bottom surface, and an angle that is not equal to 0 degrees is substantially formed between the supporting surface and the bottom surface. The first conductive layer is disposed on the bottom surface and includes a plurality of first conductive lines. The second conductive layer is disposed on the supporting surface and extends to the top surface. The second conductive layer includes a plurality of second conductive lines. The second conductive lines on the supporting surface have a first pin layout, and the second conductive lines on the top surface have a second pin layout that is different from the first pin layout. The second pin layout matches the pin layout of the first conductive lines on the bottom surface. The electronic component has a plurality of component electrodes respectively coupled to the second conductive lines on the supporting surface. The substrate has a plurality of substrate electrodes respectively coupled to the first conductive lines on the bottom surface.

BRIEF DESCRIPTION OF THE DRAWINGS

The disclosure can be more fully understood by reading the subsequent detailed description and examples with references made to the accompanying drawings, wherein.

DETAILED DESCRIPTION OF THE DISCLOSURE

Figure 1:
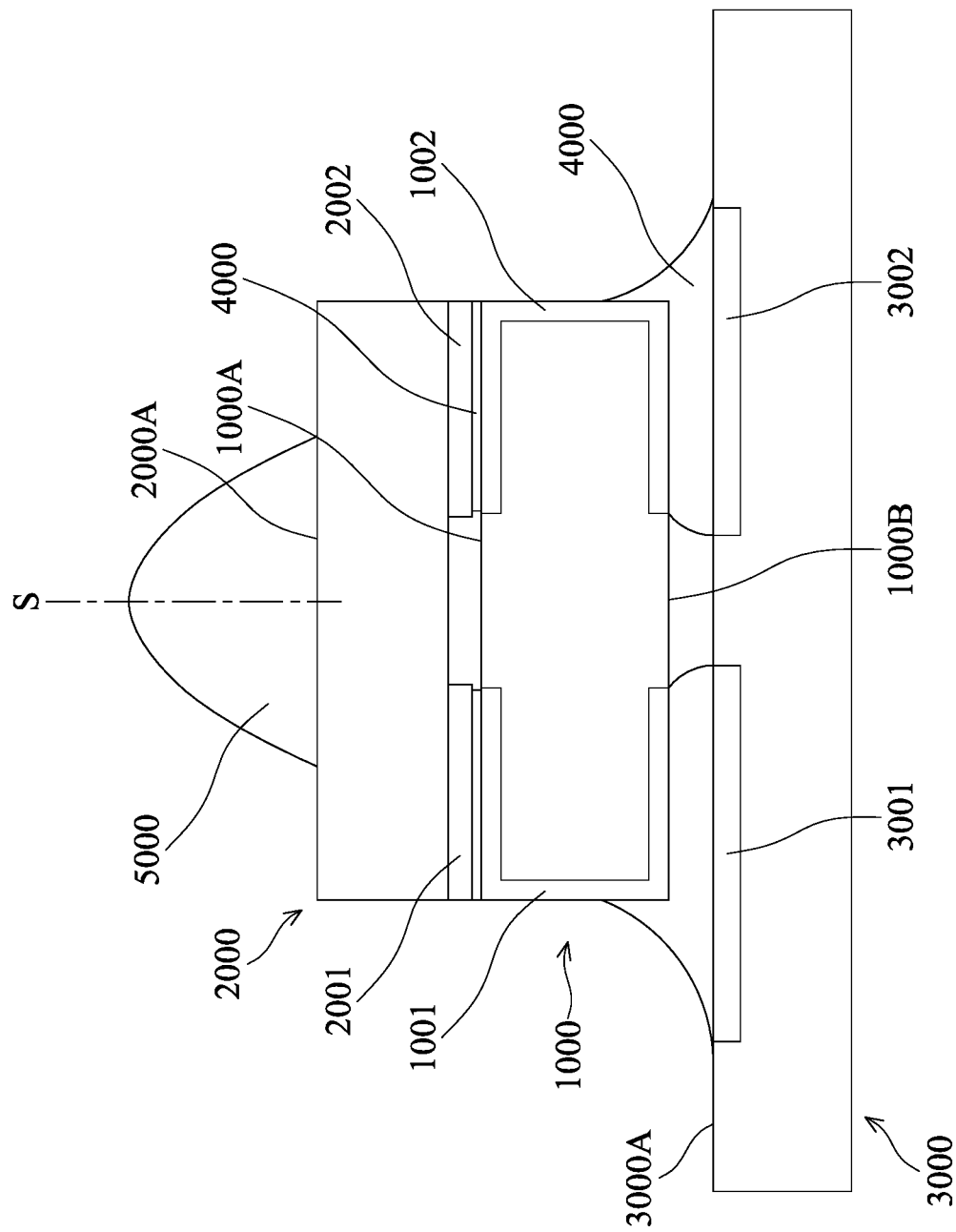
FIG. 1 shows a schematic cross-sectional view of a conventional technology, in which a light-emitting diode is mounted on a substrate through a sub-mount using surface mount technology (SMT).

In order to illustrate the purposes, features and advantages of the disclosure, the preferred embodiments and figures of the disclosure are shown in detail as follows.

In the following detailed description, the orientations of "on", "above", "below" and the like are used for representing the relationship between the relative positions of each part or element as illustrated in the drawings, and are not meant to limit the disclosure. When it is mentioned that a first element is located on a second element, it may include cases where the first element and the second element are in direct contact or are separated by one or more other elements.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Elements not shown or described in the drawings are in the form known to those with ordinary knowledge in the art.

As shown in FIG. 1, a conventional method of mounting a light-emitting diode component using surface mount technology includes: firstly, two electrodes 2001 and 2002 of a light-emitting diode 2000 are respectively coupled to two electrodes 1001 and 1002 of a sub-mount 1000, for example, through a soldering material 4000 (for example, solder paste) and a reflow process. Then, the electrodes 1001 and 1002 of the sub-mount 1000 are respectively coupled to two electrodes 3001 and 3002 on a mounting surface 3000A of a circuit substrate 3000, for example, through a soldering material 4000 (for example, solder paste) and a reflow process. Accordingly, the electrical connection between the light-emitting diode 2000 and the circuit substrate 3000 is achieved.

Typically, the conventional sub-mount 1000 has a component supporting surface 1000A (for example, the top surface shown) and a lower bonding surface 1000B (for example, the bottom surface shown) that are parallel to each other, wherein the component supporting surface 1000A and the lower bonding surface 1000B are also parallel to the mounting surface 3000A of the circuit substrate 3000. Therefore, after the light-emitting diode 2000 is mounted on the circuit substrate 3000 through the sub-mount 1000, its (output) optical axis S (which is perpendicular to the light-emitting surface 2000A) is substantially perpendicular to the mounting surface 3000A of the circuit substrate 3000.

As described above, the above design of the conventional sub-mount cannot meet this requirement. Therefore, an additional optical element 5000 (such as a lampshade) designed with a special structure is needed to change the light output angle of the light-emitting diode, which cause the cost higher.

The present disclosure provides an improved electronic component sub-mount, and an electronic component module and electronic device using the improved electronic component sub-mount. In some embodiments, the electronic component is a light-emitting diode, and the electronic component sub-mount is a sub-mount of the light-emitting diode, but the embodiments of the disclosure are not limited thereto and will be discussed further later.

Figure 2:
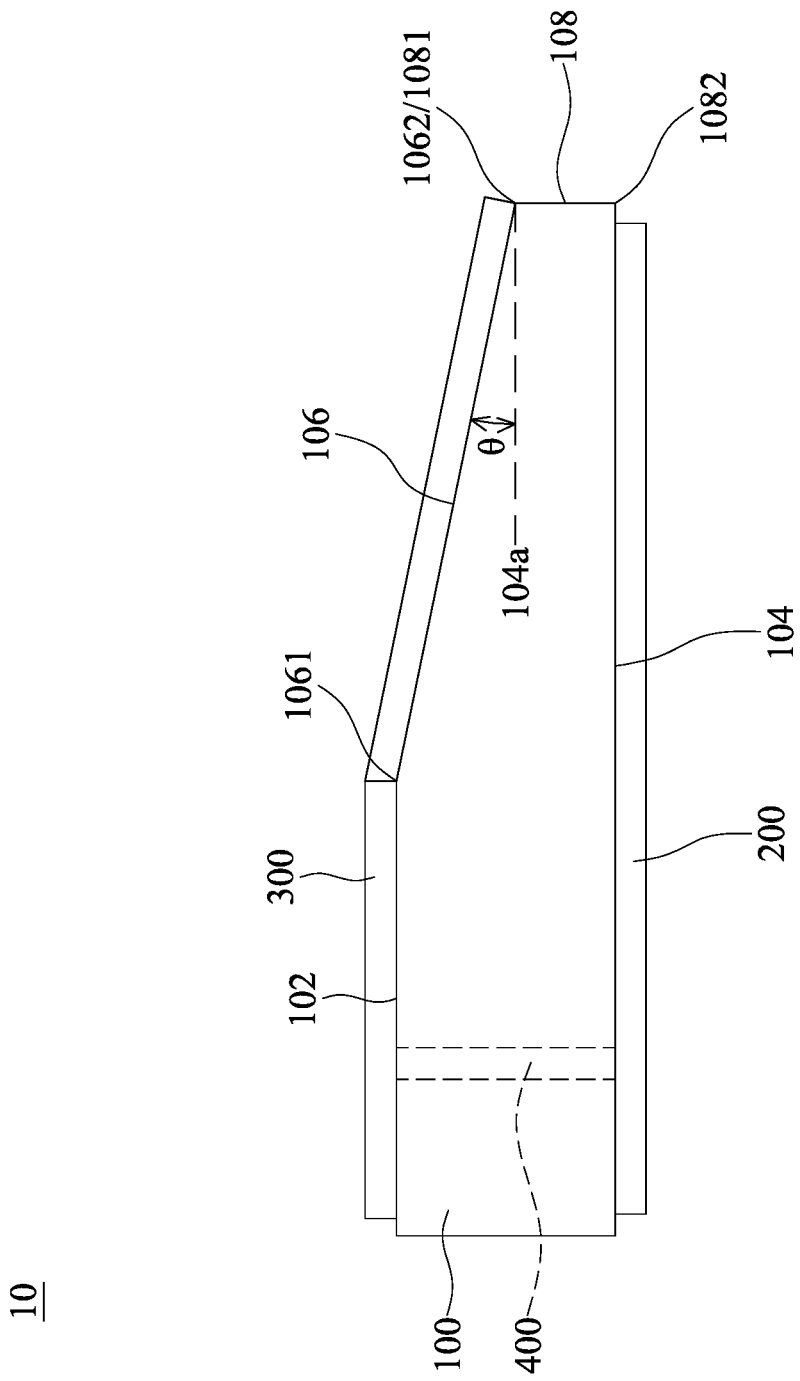
FIG. 2 shows a schematic cross-sectional view of an electronic component sub-mount, in accordance with an embodiment of the disclosure.

Referring to FIG. 2, an electronic component sub-mount 10 according to an embodiment of the disclosure includes a body 100, a first conductive layer 200, and a second conductive layer 300. The body 100 includes a top surface 102, a bottom surface 104, and a supporting surface 106 for supporting an electronic component 20, which will be discussed in the corresponding description of FIG. 3. The top surface 102 and the bottom surface 104 are located on opposite sides of the body 100. The supporting surface 106 is located on one side of the body 100 between the top surface 102 and the bottom surface 104, and an angle θ that is not equal to 0 degrees is substantially formed between the supporting surface 106 and the bottom surface 104. Specifically, the top surface 102 and the bottom surface 104 are the upper and lower surfaces of the body 100, respectively. The supporting surface 106 is an inclined surface (connected with the top surface 102) located on one side of the body 100 (for example, the top edge 1061 of the supporting surface 106 is in contact with the top surface 102), and there is an angle θ formed between the supporting surface 106 and the parallel line 104a of the bottom surface 104. In some embodiments, the angle θ is less than 90 degrees, such as between 30 degrees and 85 degrees, However, other suitable angle ranges may also be formed, depending on the angle at which the optical axis S of the electronic component 20, such as a light-emitting diode, needs to be rotated, which will be further described in the embodiment shown in FIG. 4 below.

Figure 3:
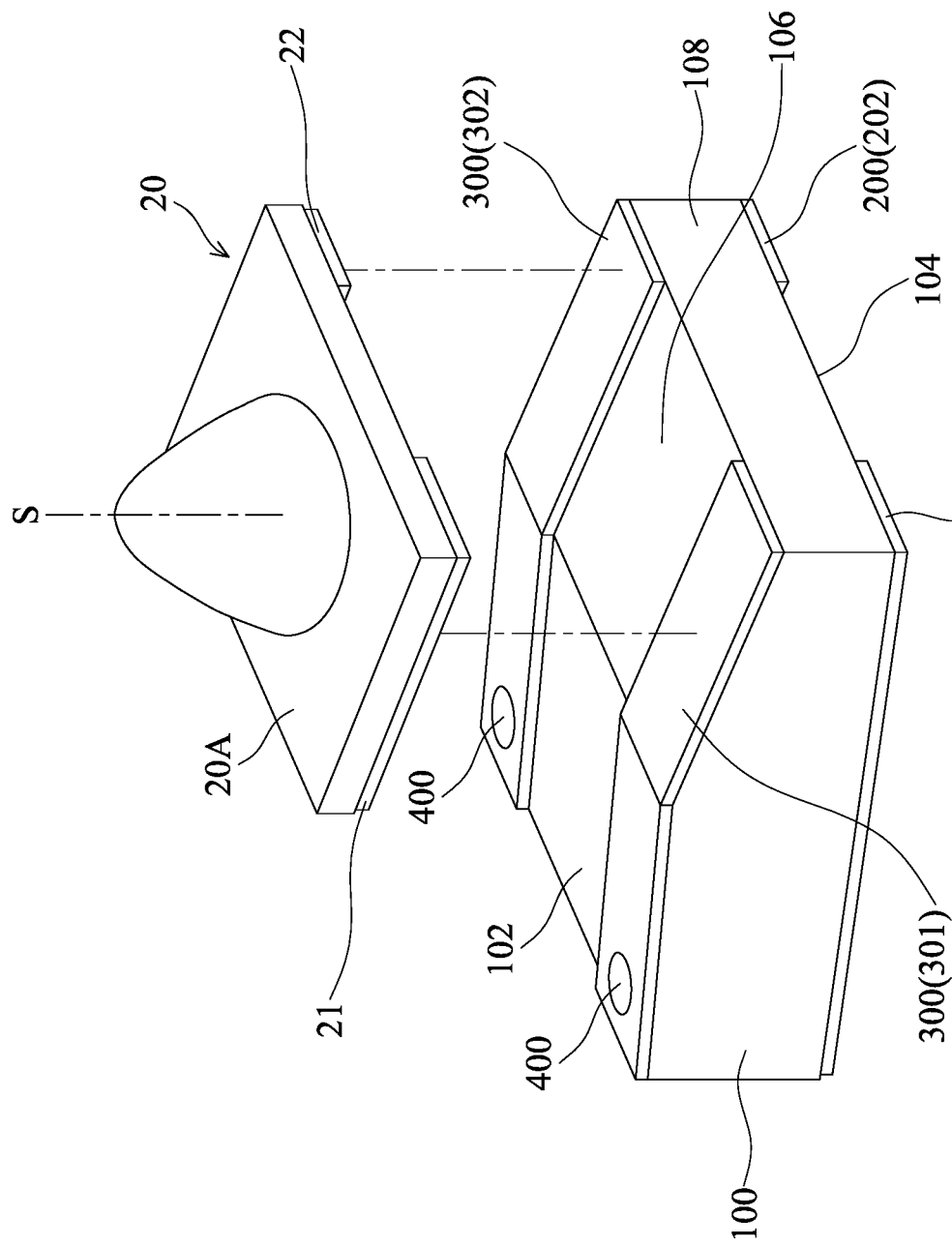
FIG. 3 shows an exploded view of an electronic component module, in accordance with an embodiment of the disclosure.

The first conductive layer 200 is disposed on the bottom surface 104 of the body 100, wherein the first conductive layer 200 covers at least part of the bottom surface 104. The second conductive layer 300 is disposed on the supporting surface 106 and extends to the top surface 102, wherein the second conductive layer 300 covers at least part of the supporting surface 106 and part of the top surface 102. Specifically, in this embodiment, the first conductive layer 200 includes two first conductive lines 201, 202, and the second conductive layer 300 includes two second conductive lines 301, 302. The (lower) first conductive lines 201, 202 are aligned with the corresponding (upper) second conductive lines 301, 302, respectively (as shown in FIG. 3). Moreover, the electronic component sub-mount 10 also includes a plurality of conductive vias 400, which respectively communicate with the top surface 102 and the bottom surface 104 of the body 100, and are coupled to the first conductive lines 201, 202 on the bottom surface 104 and the second conductive lines 301, 302 on the top surface 102. In one embodiment, there are two conductive vias 400. One conductive via 400 is coupled to the first conductive line 201 and the second conductive line 301, and the other conductive via 400 is coupled to the first conductive line 202 and the second conductive line 302. Each conductive via 400 includes a through hole communicating with the top surface 102 and the bottom surface 104 of the body 100, and a conductive material is filled in the through hole. Accordingly, the first conductive layer 200 and the second conductive layer 300 are electrically connected through the conductive vias 400.

In the embodiment shown in FIG. 2, the body 100 of the electronic component sub-mount 10 further includes a first lateral surface 108 disposed between the supporting surface 106 and the bottom surface 104. For example, the top edge 1081 of the first lateral surface 108 is in contact with the bottom edge 1062 of the supporting surface 106, and the bottom edge 1082 of the first lateral surface 108 is in contact with the bottom surface 104. In this embodiment, the angle formed between the first lateral surface 108 and the bottom surface 104 is substantially equal to 90 degrees, i.e., the first lateral surface 108 is perpendicular to the bottom surface 104. In other embodiments, an angle that is less than 90 degrees can also be formed between the first lateral surface 108 and the bottom surface 104. The disposition of the first lateral surface 108 provides the height difference between the bottom edge 1062 of the supporting surface 106 and the bottom surface 104, so that the electronic component sub-mount 10 can raise the electronic component 20 disposed thereon. The height of the first lateral surface 108 can be changed according to actual requirements. In some other embodiments (not shown), the first lateral surface 108 may also be omitted, so that the bottom edge 1062 of the supporting surface 106 is in contact with the bottom surface 104, but the second conductive layer 300 on the supporting surface 106 and the first conductive layer 200 on the bottom surface 104 remain physically separated.

In various embodiments, the above-mentioned electronic component sub-mount 10 may be a flexible substrate or a rigid substrate, such as a printed circuit board (PCB), a ceramic substrate, or another applicable electrical connection substrate, which can be formed by materials and/or processes known to those skilled in the art. As an example, the formation of the electronic component sub-mount 10 may include: a body 100 made of a dielectric material, such as epoxy glass fiber, is first provided. Then, a supporting surface 106 that is inclined to the bottom surface 104 or the top surface 102 is formed on the body 100 through a mechanical cutting process. Subsequently, a series of processes are performed, such as a deposition process, a lithography process, an etching process, a mechanical drilling process, and/or other applicable processes, to form the first conductive layer 200, the second conductive layer 300, and the conductive vias 400. The first conductive layer 200, the second conductive layer 300, and the conductive vias 400 can be made of a conductive material. For example, a metal material such as copper. Compared with the conventional sub-mount that without the inclined supporting surface 106, the electronic component sub-mount 10 only uses low-cost mechanical cutting process to obtain the supporting surface 106 of this embodiment.

Figure 4:
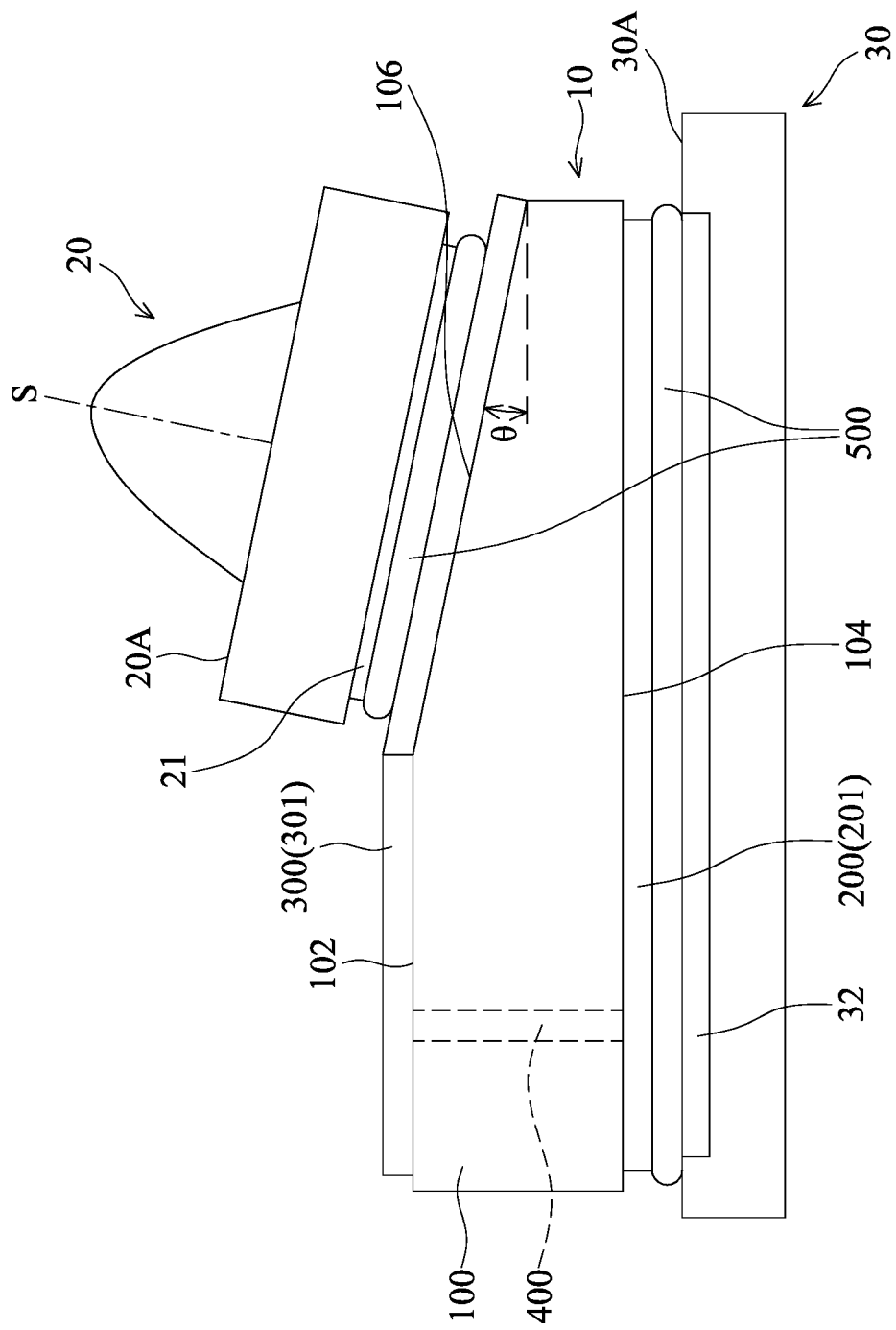
FIG. 4 shows a schematic cross-sectional view of an electronic device, in accordance with an embodiment of the disclosure.

As shown in FIG. 3, an electronic component module according to an embodiment of the disclosure includes the electronic component sub-mount 10 discussed above and an electronic component 20. In this embodiment, the electronic component 20 is a light-emitting diode. More Specifically, the electronic component 20 is a flip-chip type light-emitting diode, and has two component electrodes 21, 22 provided on the same side (for example, the lower side shown) of the electronic component 20. The electronic component 20 is mounted in a flip-chip manner so that its two component electrodes 21, 22 are respectively coupled to the two second conductive lines 301, 302 on the supporting surface 106 of the electronic component sub-mount 10. More specifically, when manufacturing the electronic component module, a soldering material 500, such as solder paste, is coated on the two component electrodes 21, 22 of the electronic component 20 or on the two second conductive lines 301, 302 on the supporting surface 106 as shown in FIG. 4, and the electronic component 20 is placed on the supporting surface 106 with the component electrodes 21, 22 contacting the second conductive lines 301, 302. Subsequently, a reflow process is performed to melt the soldering material 500 between the component electrodes 21, 22 of the electronic component 20 and the second conductive lines 301, 302 on the supporting surface 106 at a high temperature. The soldering material 500 is cured after a period of time or under specific conditions, such as under exposure to light, thereby coupling the electronic component 20 to the electronic component sub-mount 10.

As shown in FIG. 4, an electronic device according to an embodiment of the disclosure includes the above electronic component module, which includes the electronic component 20 coupled to the electronic component sub-mount 10, and a substrate 30. In this embodiment, the substrate 30 is a circuit substrate, such as a printed circuit board. The substrate 30 has two substrate electrodes 32 respectively coupled to the two first conductive lines 201, 202 on the bottom surface 104, which is also referred to as the lower bonding surface, of the electronic component sub-mount 10. In FIG. 4, due to the limitation of viewing angle, only one substrate electrode 32 and one corresponding first conductive line 201 are shown. Similar to the manufacturing of the electronic component module discussed above, the first conductive lines 201, 202 on the bottom surface 104 of the electronic component sub-mount 10 can also be respectively coupled to the two substrate electrodes 32, 32 on the mounting surface 30A of the substrate 30 by the soldering material 500, such as solder paste, and reflow process. As a result, the electronic component 20 is mounted on the substrate 30 through the electronic component sub-mount 10.

For the electronic device shown in FIG. 4, an angle θ is formed between the supporting surface 106 and the bottom surface 104 of the electronic component sub-mount 10 so the two surfaces are not parallel to each other. Thus, there is also an angle θ formed between the light-emitting surface 20A of the electronic component 20 located on the supporting surface 106 and the bottom surface 104 as well as the mounting surface 30A of the substrate 30 parallel to the bottom surface 104. With this design, after the electronic component 20 is mounted on the substrate 30 through the electronic component sub-mount 10, its (output) optical axis S which is substantially perpendicular to the light-emitting surface 20A is not perpendicular to the mounting surface 30A of the substrate 30, and can be turned to different angles (i.e., Off-Axis design). According to the various angles at which the optical axis S of the electronic component 20 needed to be rotated in practical applications, the angle θ between the supporting surface 106 and the bottom surface 104 of the electronic component sub-mount 10 can also be changed to meet the requirements. In this way, there is unnecessary to use an additional optical element like a lampshade with a special optical structure to change the light output angle of the electronic component 20, and an optical off-axis type electronic device can be realized at a lower cost.

Figure 5:
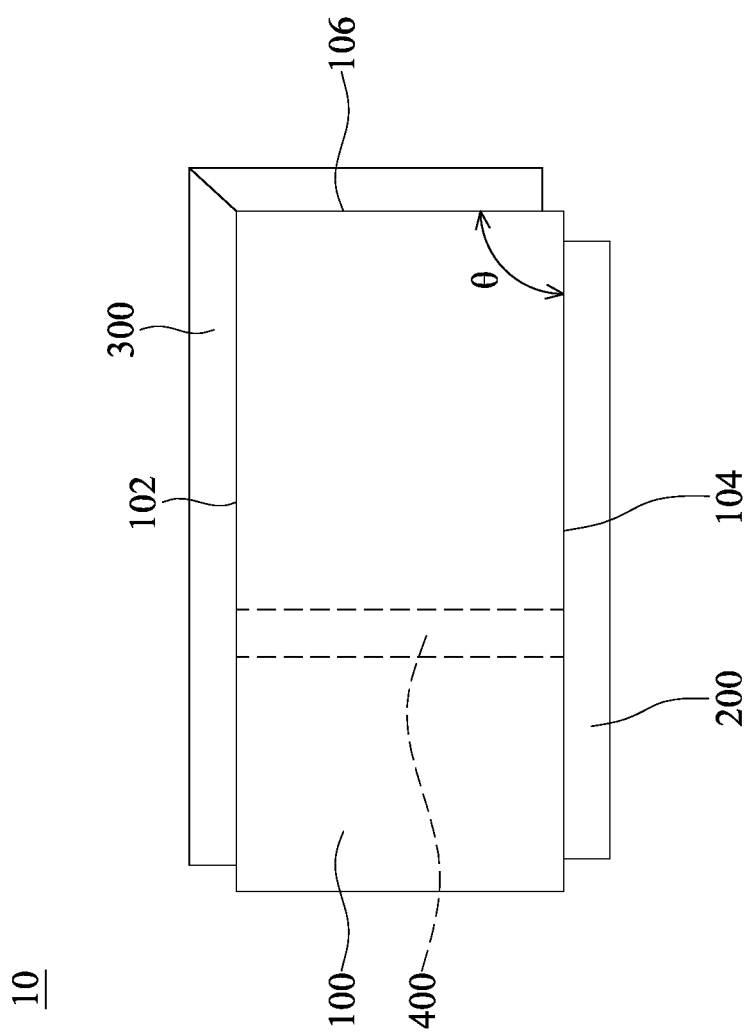
FIG. 5 shows a schematic cross-sectional view of an electronic component sub-mount, in accordance with an embodiment of the disclosure.
Figure 6:
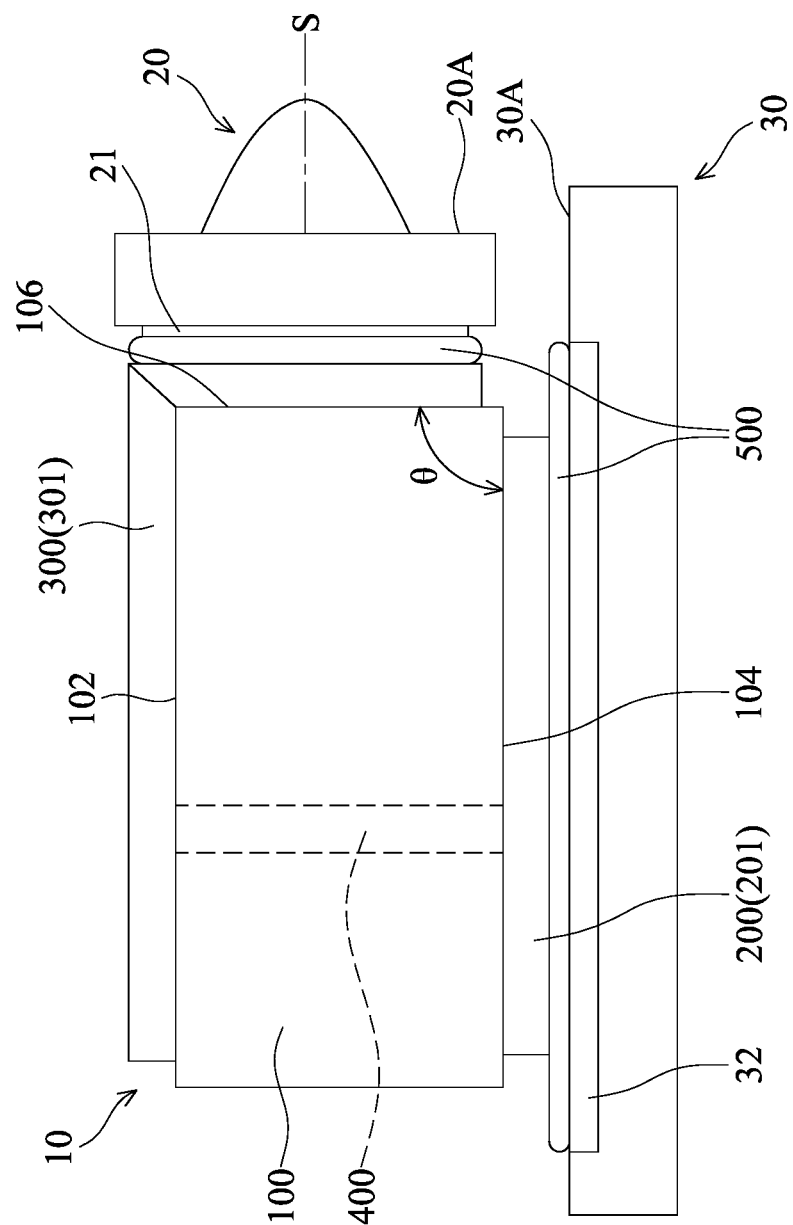
FIG. 6 shows a schematic cross-sectional view of an electronic device, in accordance with an embodiment of the disclosure.

FIG. 5 shows a schematic cross-sectional view of an electronic component sub-mount 10, in accordance with another embodiment of the disclosure. FIG. 6 shows an electronic device composed of the electronic component sub-mount 10 shown in FIG. 5. As shown in FIG. 5 and FIG. 6, this embodiment differs from the embodiment shown in FIGS. 2 to 4 in that the angle θ formed between the supporting surface 106 and the bottom surface 104 of the electronic component sub-mount 10 is substantially equal to 90 degrees. In this embodiment, the first lateral surface 108 is omitted or can be regarded as a part of the vertical supporting surface 106. With this design, after the electronic component 20 is mounted on the substrate 30 through the electronic component sub-mount 10, its (output) optical axis S is parallel to the mounting surface 30A of the substrate 30, or the light-emitting surface 20A is perpendicular to the mounting surface 30A. In other words, the light output angle of the electronic component 20 is changed to be parallel to the mounting surface 30A.

There are many variations and/or modifications can be made to embodiments of the disclosure. For example, the electronic component on the electronic component sub-mount is not limited to light-emitting diode, and could be another type of optoelectronic component, such as a light-receiving or light-emitting element. In this case, the number of electrodes of the electronic component may be greater than 2, the number of conductive lines of the first conductive layer 200 and the number of conductive lines of the second conductive layer 300 of the electronic component sub-mount may also be greater than 2, respectively. In some embodiments, the second conductive lines of the second conductive layer 300 are respectively aligned with the corresponding first conductive lines of the first conductive layer 200, which is similar to the embodiment of FIG. 3 above.

Figure 7:
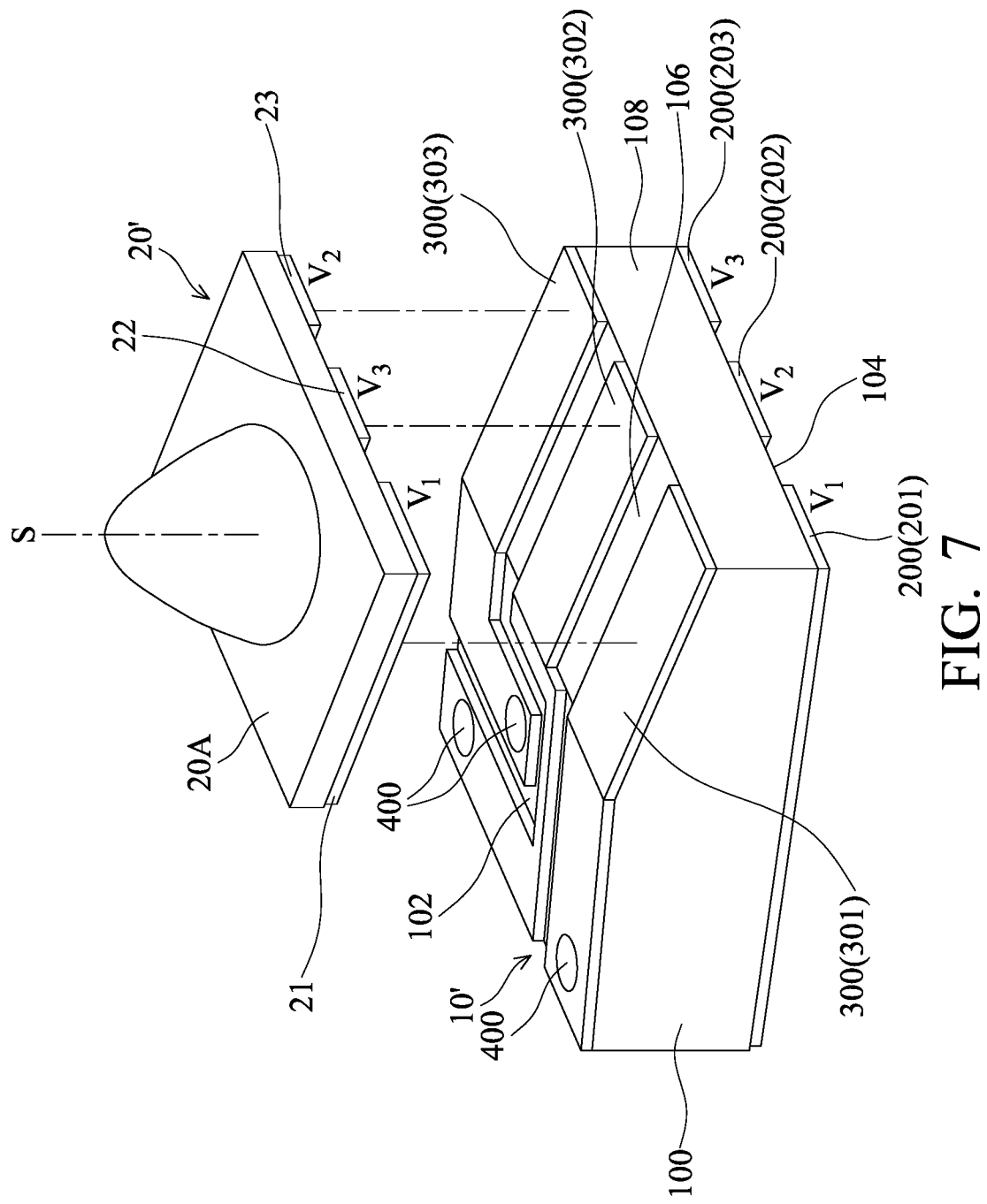
FIG. 7 shows an exploded view of an electronic component module, in accordance with an embodiment of the disclosure.

FIG. 7 shows an exploded view of an electronic component module, in accordance with another embodiment of the disclosure. In FIG. 7, the electronic component module includes an electronic component 20' and an electronic component sub-mount 10'. The electronic component 20' is an optoelectronic component, such as a light-receiving or light-emitting element, having three component electrodes 21, 22, and 23, and the number of corresponding first conductive lines (201, 202, 203) and second conductive lines (301, 302, 303) of the electronic component sub-mount 10' are also 3 respectively. The design of the second conductive layer 300 of the electronic component sub-mount 10' is different from above, and will be further described below.

In the electronic component module shown in FIG. 7, the three component electrodes 21, 22 and 23 of the electronic component 20' are respectively designed as pin 1 (V1), pin 3 (V3) and pin 2 (V2), and the three first conductive lines 201, 202 and 203 located on the bottom surface 104 of the electronic component sub-mount 10' are respectively designed as pin 1 (V1), pin 2 (V2) and pin 3 (V3), resulting in mismatch of pins. In order to enable the electronic component sub-mount 10' to be compatible with the electronic component 20' with the above-mentioned pin design, the second conductive layer 300 of the electronic component sub-mount 10' is designed as follows: the second conductive lines (301, 302, 303) located on the supporting surface 106 may have a first pin layout, and the second conductive lines (301, 302, 303) located on the top surface 102 may have a second pin layout that is different from the first pin layout, wherein the second pin layout matches the pin layout of the first conductive lines (201, 202, 203) located on the bottom surface 104. More specifically, as shown in FIG. 7, the three second conductive lines 301, 302, and 303 located on the supporting surface 106 are respectively aligned with the corresponding three component electrodes 21, 22, and 33 of the electronic component 20' while some of the second conductive lines extending to the top surface 102 changes their position. For example, the positions of the second conductive lines 302 and 303 are switched. Also, the second conductive lines 301, 302, and 303 located on the top surface 102 are electrically connected to the corresponding first conductive lines 201, 202, and 203 located on the bottom surface 104 through the conductive vias 400. Accordingly, the pin layout of the second conductive lines 301, 302, and 303 on the supporting surface 106 can be changed to match the pin layout of the component electrodes 21, 22, and 23 of the electronic component 20', and not corresponding to the pin layout of the first conductive lines 201, 202, and 203 on the bottom surface 104. Therefore, the electronic component sub-mount 10' is compatible with the electronic component 20'.

It should be understood that the geometric shapes, configuration (for example, the design of the second conductive layer 300 shown in FIG. 7 above), and manufacturing method described herein are only illustrative, and are not intended to be, and should not be constructed to be, limiting to the present disclosure. Many alternatives and modifications will be apparent to those skilled in the art, once informed by the present disclosure.

Figure 8:
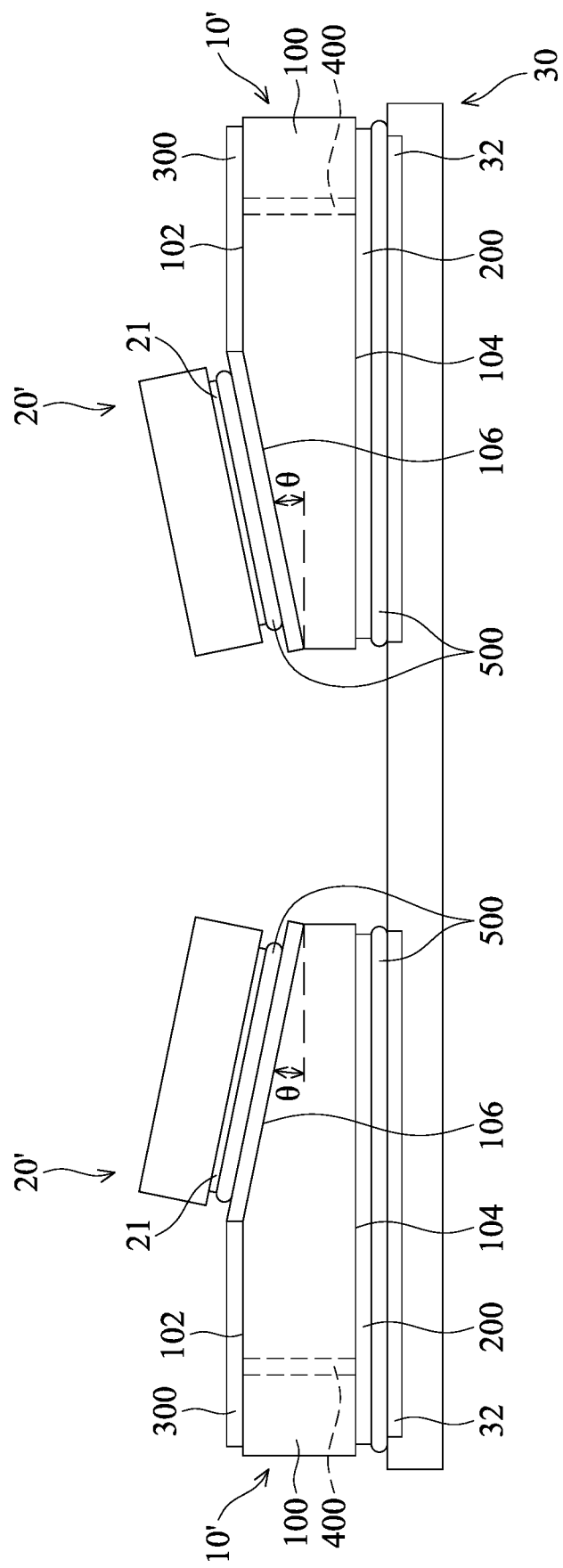
FIG. 8 shows a schematic cross-sectional view of an electronic device, in accordance with an embodiment of the disclosure.

Many variations and/or modifications can also be made to embodiments of the disclosure. For example, in some embodiments, the electronic device may also include a plurality of electronic component modules disposed on the sub-mount, as shown in FIG. 8. In FIG. 8, two electronic component modules similar to the electronic component module shown in FIG. 7 are mounted on the same substrate 30 and spaced apart from each other, wherein the two electronic component sub-mounts 10' of the two electronic component modules are arranged in pairs. More specifically, the supporting surfaces 106 of the bodies 100 of the two electronic component sub-mounts 10' are arranged oppositely, for example, the supporting surface 106 of one of the two electronic component sub-mounts 10' is adjacent to and faces the supporting surface 106 of the other electronic component sub-mount 10'. In this embodiment, the angle θ between the supporting surface 106 and the bottom surface 104 of the two electronic component sub-mounts 10' is the same. For example, the angle θ is about 45 degrees, but the disclosure is not limited thereto. In addition, the electronic component 20' disposed on the supporting surface 106 of one of the electronic component sub-mounts 10' is a light-emitting element, and the electronic component 20' disposed on the supporting surface 106 of the other electronic component sub-mounts 10' is a light-receiving element. Therefore, in the electronic device embodiment shown in FIG. 8, the light-emitting element and the light-receiving element are arranged oppositely, so that the light-receiving element can receive the light signal emitted from the light-emitting element, thereby realizing the function of an optical transceiver module.

As described above, the present disclosure provides an improved electronic component sub-mount. The component supporting surface and the bottom surface (or top surface) of the sub-mount are not parallel so that the light output/input angle of the carried electronic component can be changed without an additional optical element like a lampshade with special optical structure design. Therefore, it can meet different application requirements and reduce costs. In addition, in some embodiments, the electrodes or conductive lines of the component supporting surface and the lower bonding surface (i.e., the bottom surface) of the electronic component sub-mount can also have different pin layouts to be compatible with electronic components of different designs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic component sub-mount adapted to support an electronic component, the electronic component sub-mount comprising:
   a body having a top surface, a bottom surface, and a supporting surface, wherein the top surface and the bottom surface are located on opposite sides of the body, the supporting surface is located on one side of the body between the top surface and the bottom surface, and an angle that is not equal to 0 degrees is substantially formed between the supporting surface and the bottom surface, wherein the angle is equal to or less than 90 degrees;
   a first conductive layer disposed on the bottom surface, wherein the first conductive layer includes a plurality of first conductive lines; and
   a second conductive layer disposed on the supporting surface and extending to the top surface, wherein the second conductive layer includes a plurality of second conductive lines, wherein the second conductive lines on the supporting surface have a first pin layout, and the second conductive lines on the top surface have a second pin layout that is different from the first pin layout, wherein the second pin layout matches a pin layout of the first conductive lines on the bottom surface,
   wherein the body further includes a first lateral surface disposed between the supporting surface and the bottom surface, and
   wherein a top edge of the supporting surface is in contact with the top surface, and a bottom edge of the supporting surface is in contact with the first lateral surface, wherein the top edge of the supporting surface is higher than the bottom edge of the supporting surface.

2. The electronic component sub-mount as claimed in claim 1, further comprising a plurality of conductive vias communicating with the top surface and the bottom surface of the body, wherein the conductive vias are coupled to the first conductive lines on the bottom surface and the second conductive lines on the top surface.

3. The electronic component sub-mount as claimed in claim 1, wherein the second conductive lines on the supporting surface are physically separated from the first conductive lines on the bottom surface by the first lateral surface.

4. The electronic component sub-mount as claimed in claim 1, wherein an angle formed between the first lateral surface and the bottom surface is substantially equal to 90 degrees.

5. An electronic component sub-mount adapted to support an electronic component, the electronic component sub-mount comprising:
   a body having a top surface, a bottom surface, and a supporting surface, wherein the top surface and the bottom surface are located on opposite sides of the body, the supporting surface is located on one side of the body between the top surface and the bottom surface, and an angle that is not equal to 0 degrees is substantially formed between the supporting surface and the bottom surface, wherein the angle is equal to or less than 90 degrees;
   a first conductive layer disposed on the bottom surface, wherein the first conductive layer includes a plurality of first conductive lines; and
   a second conductive layer disposed on the supporting surface and extending to the top surface, wherein the second conductive layer includes a plurality of second conductive lines, wherein the second conductive lines on the supporting surface have a first pin layout, and the second conductive lines on the top surface have a second pin layout that is different from the first pin layout, wherein the second pin layout matches a pin layout of the first conductive lines on the bottom surface,
   wherein the body further includes a first lateral surface disposed between the supporting surface and the bottom surface,
   wherein an angle formed between the first lateral surface and the bottom surface is substantially equal to 90 degrees, and
   wherein a top edge of the first lateral surface is in contact with the supporting surface, and a bottom edge of the first lateral surface is in contact with the bottom surface.

* * * * *